United States Patent [19]

Jun

[11] Patent Number: 5,270,561

[45] Date of Patent: Dec. 14, 1993

[54] SEMICONDUCTOR MEMORY DEVICE WITH A RING-SHAPED BIT LINE

[75] Inventor: Young K. Jun, Seoul, Rep. of Korea

[73] Assignee: Goldstar Electron Co., Ltd., Rep. of Korea

[21] Appl. No.: 850,676

[22] Filed: Mar. 13, 1992

[30] Foreign Application Priority Data

Mar. 15, 1991 [KR] Rep. of Korea .................. 4137/1991
Mar. 15, 1991 [KR] Rep. of Korea .................. 4139/1991

[51] Int. Cl.⁵ .................. H01L 29/68; H01L 29/78; H01L 29/92
[52] U.S. Cl. .................. 257/306; 257/382; 257/401; 257/905
[58] Field of Search .......... 357/23.6, 45, 68, 23.6 G; 437/60; 257/306, 382, 401, 905

[56] References Cited

U.S. PATENT DOCUMENTS 4,864,375  9/1989  Teng et al. .................. 357/23.6 G
5,111,275  5/1992  Sawada et al. .................. 357/45

*Primary Examiner*—Rolf Hille
*Assistant Examiner*—Robert Limanek
*Attorney, Agent, or Firm*—Faegre & Benson

[57] ABSTRACT

The invention relates to a semiconductor memory device in which a bit line ring which functions as a bit line is formed at the upper and lower stage of the bit line and a storage node is formed to be overlapped in the same direction with said bit line formed perpendicularly to a word line to improve the integration degree.

Therefore, a capacitor area can be increased without an increase of an area of the unit cell to improve the integration degree of a semiconductor memory device and the generation of the bent portion of the active region can be avoided to decrease the distortion.

9 Claims, 14 Drawing Sheets

F I G. 5a
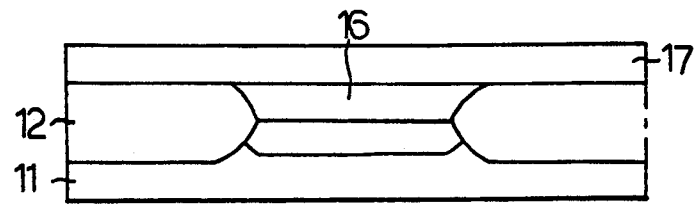
F I G. 5b
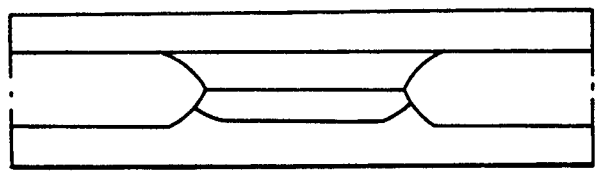
F I G. 5c
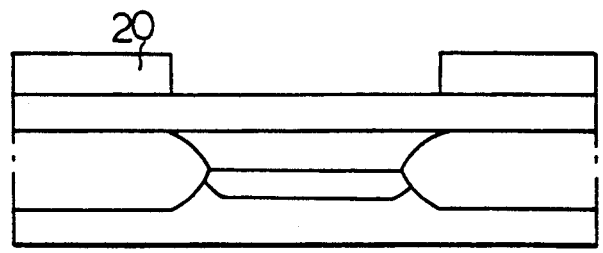

F I G. 5d
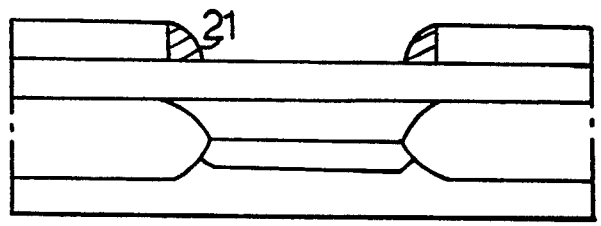
F I G. 5e
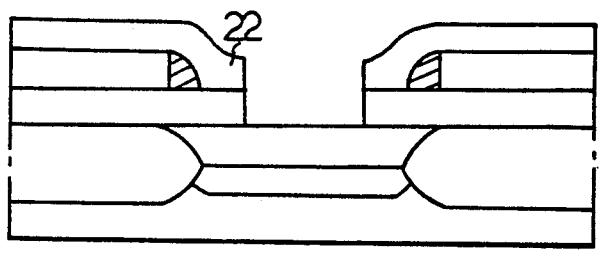
F I G. 5f
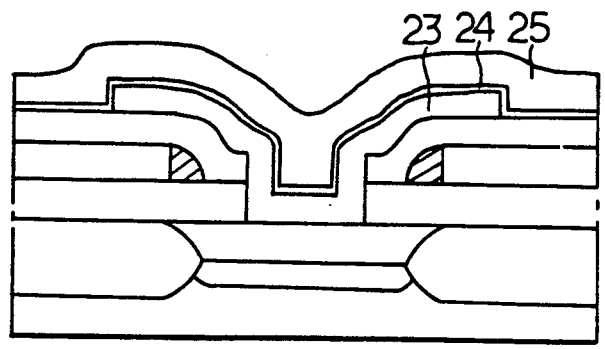

F I G. 8d
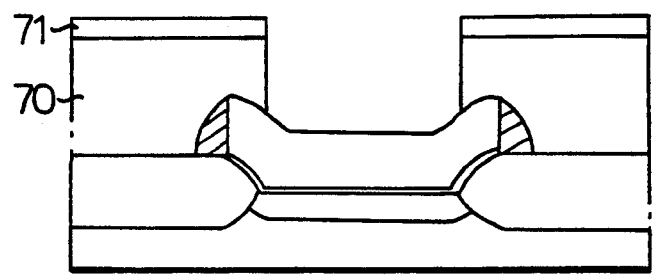
F I G. 8e
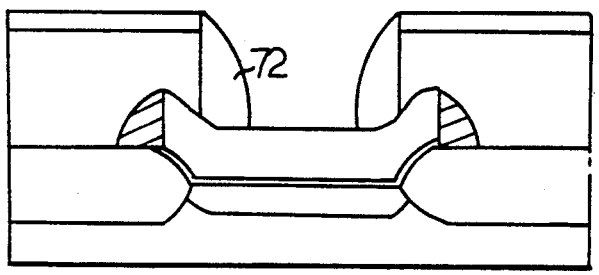
F I G. 8f
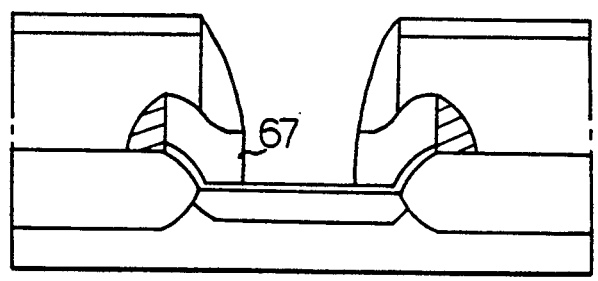

SEMICONDUCTOR MEMORY DEVICE WITH A RING-SHAPED BIT LINE

BACKGROUND OF THE INVENTION

The present invention relates to a semiconductor memory device and a method for fabrication thereof, in which a bit line and a storage node are overlapped to improve the integration degree.

FIGS. 1(a) through (d) show cross-sectional views of a device at various stages of a fabrication process according to the prior art.

First, as shown in FIG. 1 (a), a gate 2, a source and drain region 3 and an oxide film 4 are successively formed on a semiconductor substrate 1.

As shown in FIG. 1(b), a bit line contact is formed and a bit line 5 which is either a refractory metal or a silicide and an oxide film 6 are deposited and then patterned to restrict the fixed portion.

As shown in FIG. 1(c), a side wall 7 of the oxide film is formed at both sides of the oxide film 6 and the bit line 5.

As shown in FIG. 1(d), a capacitor consisting of a storage node 8, a dielectric film 9 and a plate 10 is formed, thereby completing fabrication of the prior semiconductor memory device.

However, in semiconductor memory devices fabricated by aforesaid conventional method, as shown in FIG. 2, bit line 5 and storage node 8 are separated in the three dimensions and the active region(AR) is diagonally aligned against the word line 2 and the bit line 5. Therefore, the area of a unit cell is increased and distortion is caused by the bent portion of the active region(AR) generated in processing.

SUMMARY OF THE INVENTION

The present invention provides a semiconductor memory device and method for fabrication thereof, in which an active region is aligned against a bit line in the same direction and a bit line and a storage node are overlapped to improve the integration degree.

To obtain the above object, there is provided a semiconductor memory device in which a bit line is formed perpendicularly to a word line and a storage node is formed in the same direction of the bit line ring which functions as a bit line to be overlapped with said bit line.

Furthermore, the present invention provides a method for fabrication of a semiconductor memory device comprising the steps of successively forming a field oxide for isolating the devices, a gate, a source and drain region and a first oxide film which covers said gate on a semiconductor substrate;

filling a doped polysilicon film in the buried contact region;

forming a second oxide film at portion which is removed from a bit line contact region;

filling a second doped polysilicon film in said bit line contact region;

forming a bit line in said bit line contact region;

forming an insulating film for leveling the surface within the width of bit line;

forming a side wall of the same material as said bit line at the sides of said bit line and said insulating film for leveling the surface;

depositing a third oxide film on the whole surface;

removing said second and said third oxide films in the buried contact region; and forming a capacitor consisting of a storage node, a dielectric film and a plate.

Furthermore, the present invention provides a method for fabrication of a semiconductor memory device comprising the steps of:

successively forming a field oxide for isolating the devices, a gate, a source and drain region and a first oxide film which covers the gate on a semiconductor substrate;

successively depositing a first nitride film and a second oxide film;

removing said first nitride film and said second oxide film in the bit line contact region;

forming a first side wall of a polysilicon film;

successively depositing a bit line, an insulating film for leveling the surface and a second nitride film;

removing said bit line, said insulating film and said second nitride film at the portion which is except the bit line region; [?]

forming a second side wall of a nitride film in the sides of said bit line, said insulating film and said second nitride film:

removing said exposed second oxide film;

removing the exposed first and second nitride films and the second side wall;

forming a third side wall of an oxide film; and forming a capacitor consisting of a storage node, a dielectric film and a plate.

BRIEF DESCRIPTION OF THE INVENTION

The above and other objects and features of the present invention will be apparent from the following description of a preferred embodiment of the invention in conjunction with the accompanying drawings, in which:

FIGS. 1(a) through (d) are process diagrams for fabricating a semiconductor memory device according to the prior art;

Figure 1A:
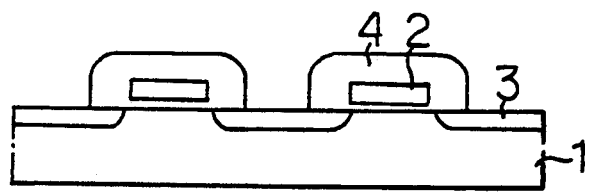
Figure 1B:
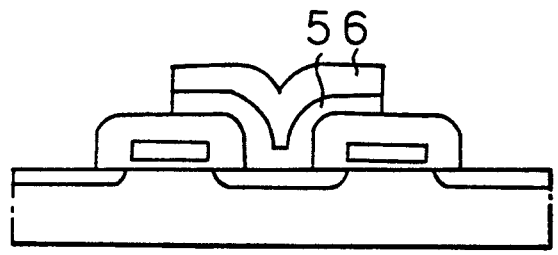
Figure 1C:
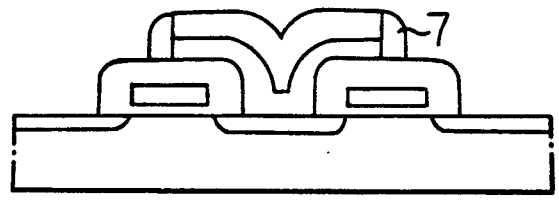
Figure 1D:
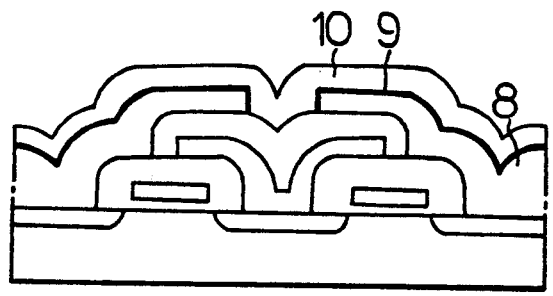
Figure 2:
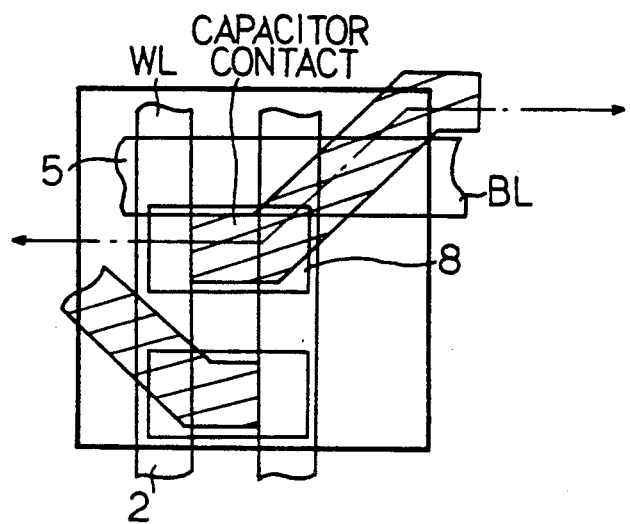
FIG. 2 is a lay-out of a semiconductor memory device of FIG. 1.
Figure 3:
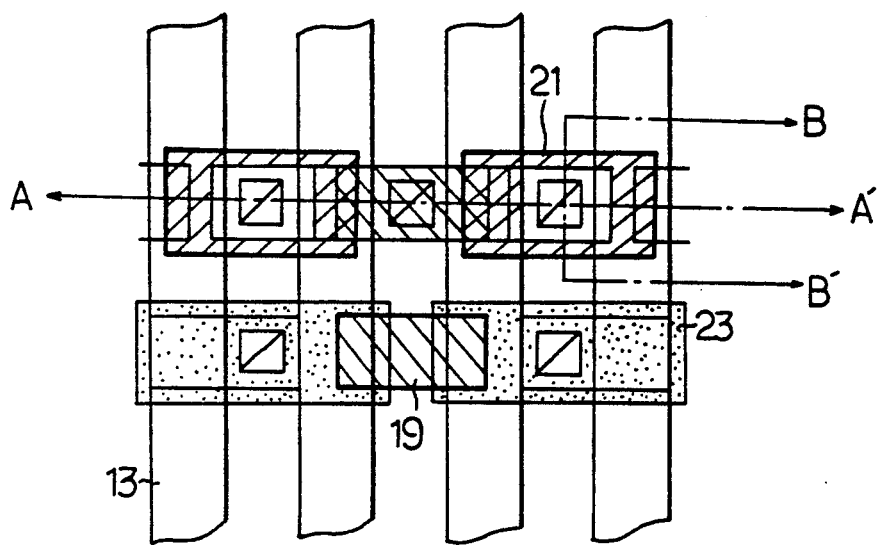
FIG. 3 is a lay-out of a semiconductor memory device in which a bit line and a storage node are overlapped according to a first preferred embodiment of the present invention.
Figure 6:
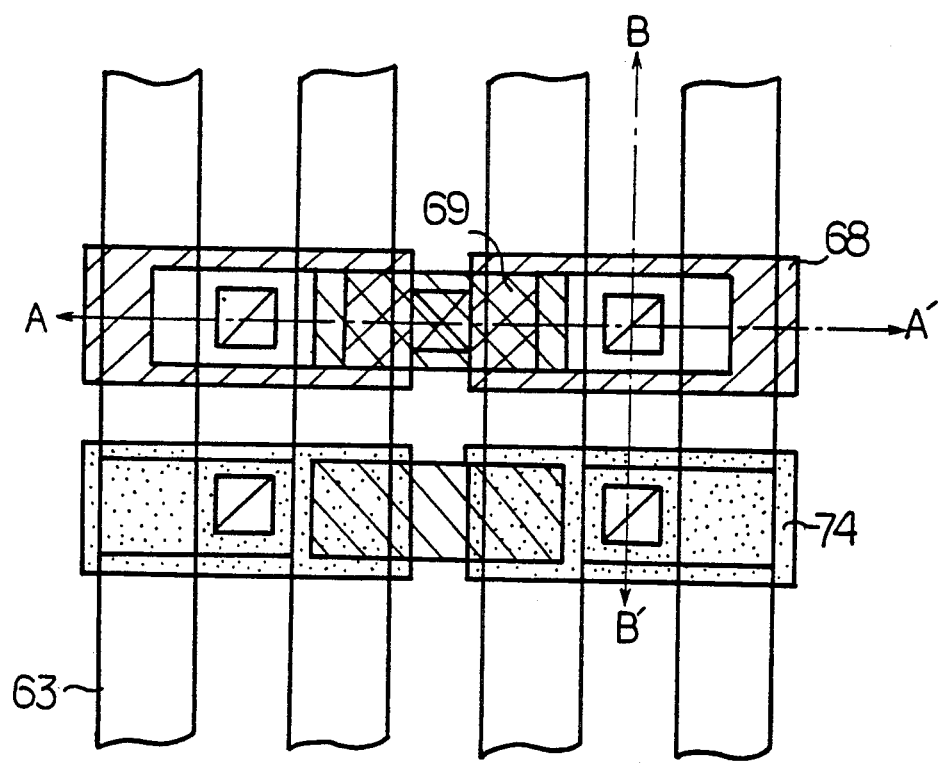

FIGS. 4(a) through (f) are cross-sectional views of a fabrication process for a semiconductormemory device of the present invention taken along line A—A' of FIG. 3;

FIGS. 5(a) through (f) are cross-sectional views of a fabrication process for a semiconductor memory device of the present invention taken along line B—B' of FIG. 3;

FIG. 6 is a lay-out of a semiconductor memory device in which a bit line and a storage node are overlapped according to a second preferred embodiment of the present invention;

FIGS. 7(a) through (i) are cross-sectional views of a fabrication process for a semiconductor memory device of the present invention taken along line A—A' of FIG. 6; and FIGS. 8(a) through (i) are cross-sectional views of a fabrication process for a semiconductor memory device of the present invention taken along line B—B' of FIG. 6.

DETAILED DESCRIPTION OF THE PREFERRED EMBODIMENT

A semiconductor memory device and a method for fabrication thereof, in which a bit line is aligned in the same direction as the word line according to the preferred embodiment of the present invention will be described in more detail with reference to the accompanying drawings.

FIG. 3 shows the lay-out of the semiconductor memory device in which a bit line and a storage node are overlapped according to the first embodiment of the present invention, and FIGS. 4(a) through (f) are cross sectional views of a fabrication process for the semiconductor memory device taken along section line A—A' of FIG. 3. FIGS. 5(a) through (f) are cross-sectional views of a fabrication process for the semiconductor memory device taken along section line B—B' of FIG. 3.

A method for fabricating the semiconductor memory device of the first embodiment of the present invention is described below with reference to FIG. 4 and FIG. 5.

Figure 4A:
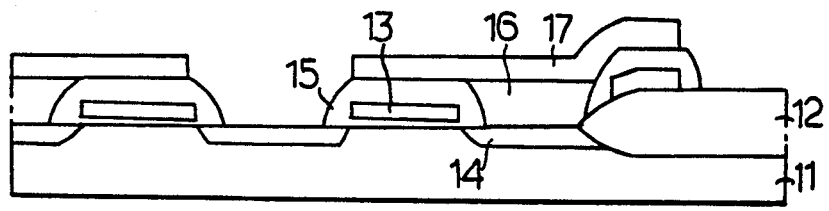

As shown in FIG. 4(a) and FIG. 5(a), a field oxide 12 for isolating the devices, a gate 13 used as the word line, the source and drain region 14 and a first oxide film 15 which covers the gate 13 are successively formed on the semiconductor substrate 11 and the doped polysilicon film 16 is filled in at the buried contact region by a deposition and etch back process. A second oxide film 17 is deposited on the whole surface and then said oxide film 17 is removed from the bit line contact region.

Figure 4B:
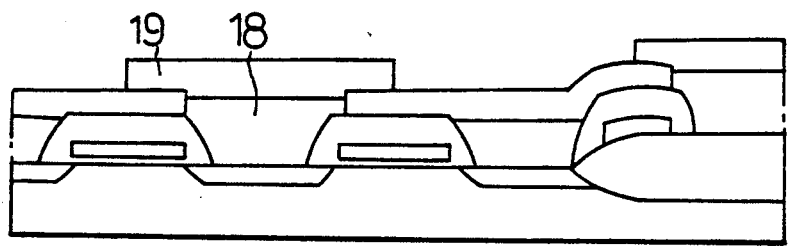

Henceforth, as shown in FIG. 4(b) and FIG. 5(b), the doped polysilicon film 18 is filled in the bit line contact region once more by an etch back process. A refractory metal film 19 is then deposited on the whole surface and the metal film 19 in the buried contact region is subsequently removed to form the bit line.

Figure 4C:
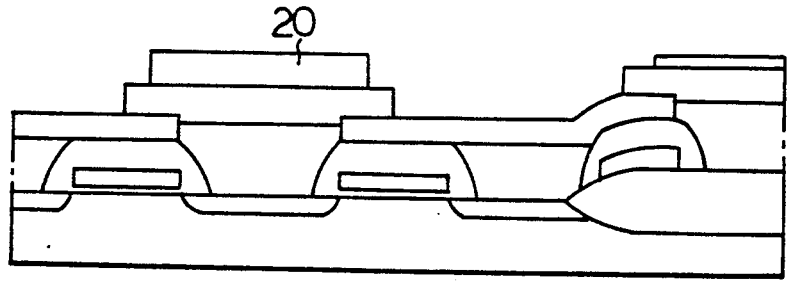

As shown in FIG. 4(c) and FIG. 5(c), an insulating film 20 for leveling the surface which is formed from boron phosphosilicate glass (BPSG) in the preferred embodiment shown is deposited on the whole and then removed except the range restricted within the width of the refractory metal film 19 by the etching process.

Figure 4D:
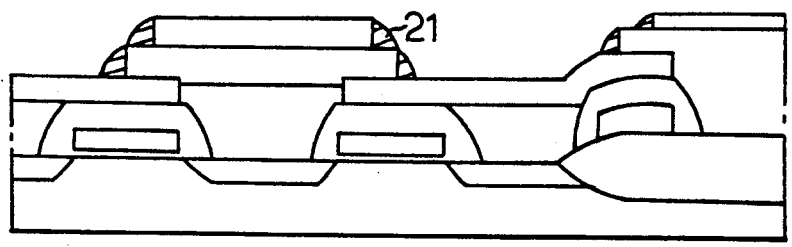

As shown in FIG. 4(d) and FIG. 5(d), a refractory metal layer 21 is deposited and then is etched back by an isotropic etching method to form a side wall (Hereinafter referred to as a bit line ring) at the side of said metal film 19 and the insulating film 20 for leveling the surface.

In the first embodiment, the bit line 19 is formed and the surface is leveled by using the insulating film 20 and then the bit line ring 21 is formed in order to overlap in the same direction the bit line 19 and a storage node to be formed according to the process set forth immediately below.

At this time, the bit line ring 21 of the refractory metal film 19 functions as the bit line and is formed at the upper stage of said bit line 19.

Figure 4E:
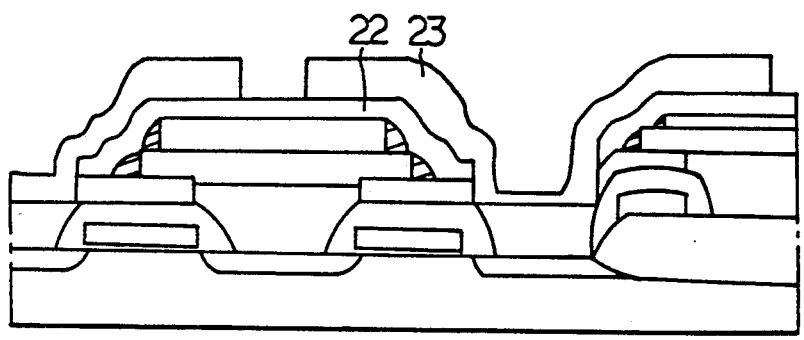

As shown in FIG. 4(e) and FIG. 5(e), an oxide film 22 is deposited on the whole surface and the oxide films 17 and 22 of the buried contact region are then removed.

Figure 4F:
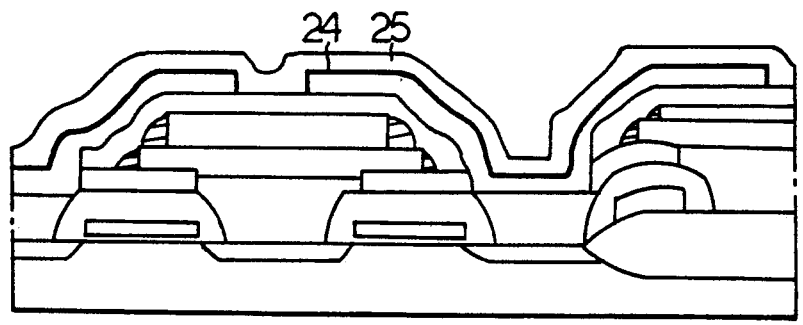

Finally, as shown in FIG. 4(f) and FIG. 5(f), a capacitor consisting of a storage node 23, a dielectric film 24 and a plate 25 is formed to complete the fabrication of a semiconductor memory device in which the bit line 19 and the storage node 23 are overlapped rather than offset with a bent active region, as in the prior art.

In the semiconductor memory device fabricated by the aforesaid method of the first preferred embodiment, as shown in FIG. 3, the bit line 19 is formed perpendicularly to the word line 13 and the storage node 23 is formed so as to be aligned in the same direction with the bit line ring 21 which functions as the bit line to be overlapped with said bit line 19 in a straight line.

In the above-mentioned semiconductor memory device in which the bit line 19 and the storage node 23 are overlapped in a straight line, the necessity for a bent region is not present. Therefore, the capacitor area is extended and the degree of integration can be improved.

FIG. 6 shows the lay-out of a semiconductor memory device in which the bit line is overlapped with a storage node according to the second embodiment of the present invention, and FIG. 7(a) through (i) are cross. sectional views of a fabrication process for the semiconductor memory device taken along line A—A' of FIG. 6 and FIG. 8(a) through (i) are cross-sectional views of a fabrication process for the semiconductor memory device taken along line B—B' of FIG. 6.

The method for fabricating the semiconductor memory device of the second embodiment of the present invention will be described with reference to the FIG. 7 and FIG. 8.

Figure 7A:
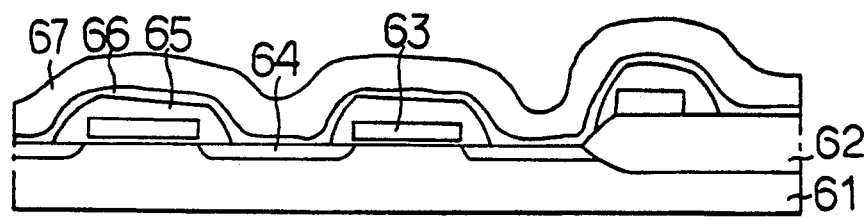
Figure 8A:
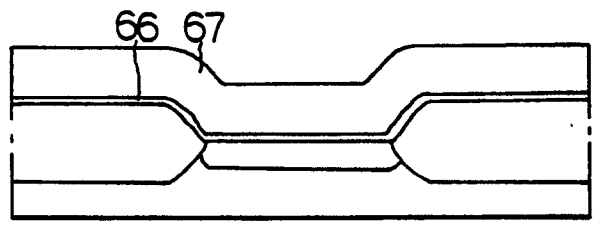

As shown in FIG. 7(a) and FIG. 8(a), a field oxide 62 for isolating the devices, the gate 63 used as the word line, the source and drain region 64 and a first oxide film 65 which cover the gate 63 are successively formed on the semiconductor substrate 61 and the nitride film 66 and the oxide film 67 are deposited on the whole surface of a semiconductor substrate 61.

Figure 7B:
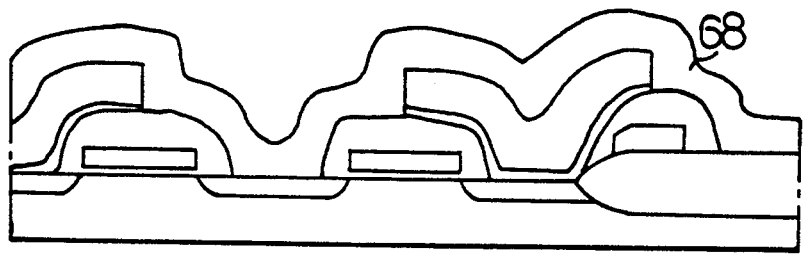
Figure 8B:
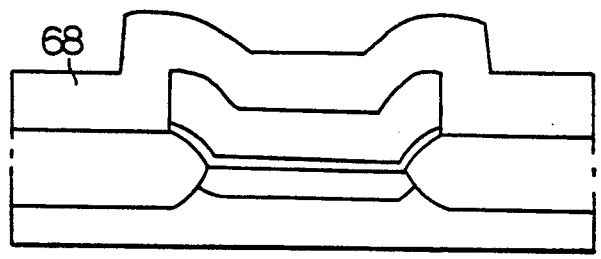

Henceforth, as shown in FIG. 7(b) and FIG. 8(b), said nitride film 66 and said oxide film 67 in the bit line contact region are removed and a polysilicon film 68 is deposited on the whole surface.

Figure 7C:
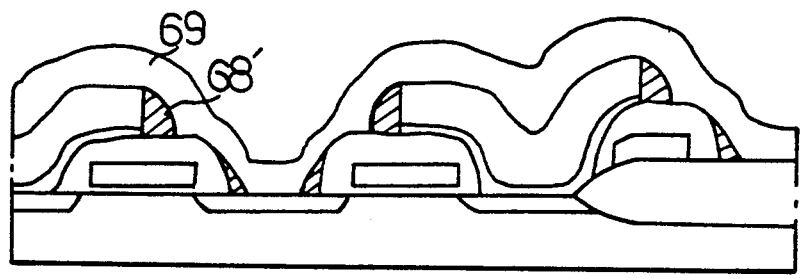
Figure 8C:
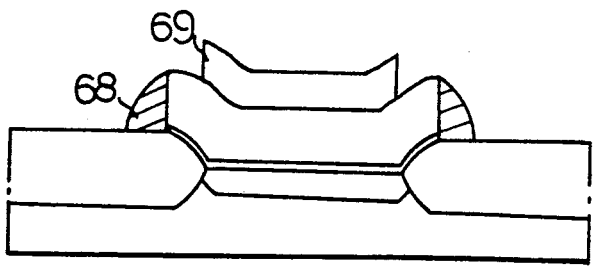

Then as shown in FIG. 7(c) and FIG. 8(c), said polysilicon film 68 is etched by an isotropic etching method to form a first side wall (bit line ring) in the side of said nitride film 66 and said oxide film 67 and the bit line 69 of the silicide or the refractory metal is formed.

Figure 7D:
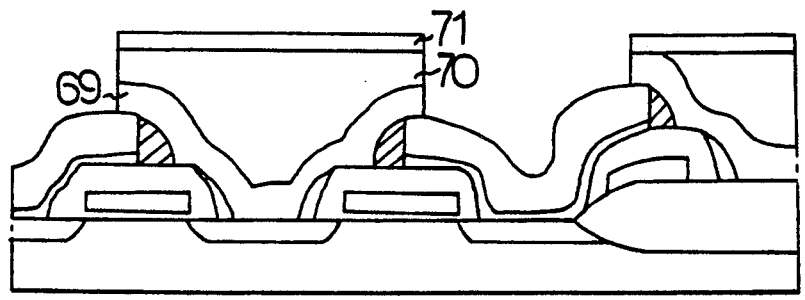

As shown in FIG. 7(d) and FIG. 8(d), an insulating film 70 for leveling the surface which may be formed of spin on glass(SOG) and polyimide or boron phosphosilicate glass (BPSG) and a second nitride film are deposited and then the nitride film 71, the insulating film 70 and the bit line 69 of a capacitor contact portion are removed.

At this time, the oxide film is capable of using for the insulating film 70 for leveling the surface.

Figure 7E:
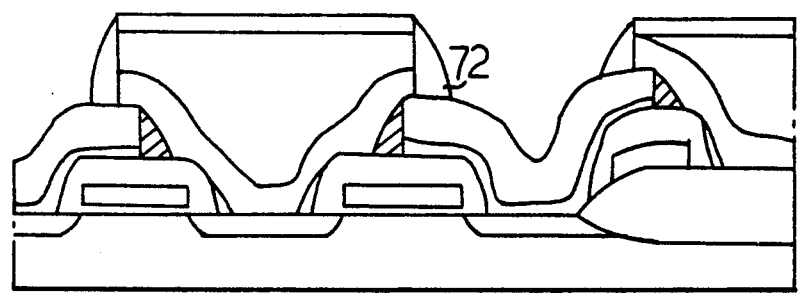

As shown in FIG. 7(e) and FIG. 8(e), a nitride film is deposited on the whole surface and etched by the isotropic method to form a second side wall 72 and at this time, said oxide film 67 is exposed.

Figure 7F:
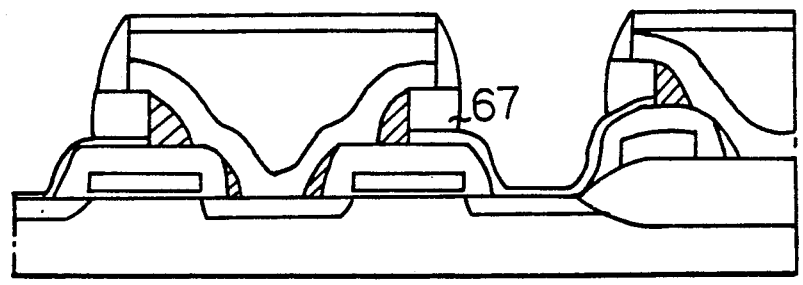

As shown in FIG. 7(f) and FIG. 8(f), said exposed oxide film 67 is removed by an isotropic etching method to expose the nitride film 66 of a capacitor contact portion.

Figure 7G:
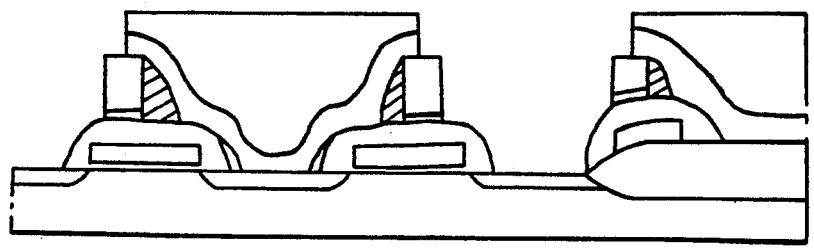
Figure 7H:
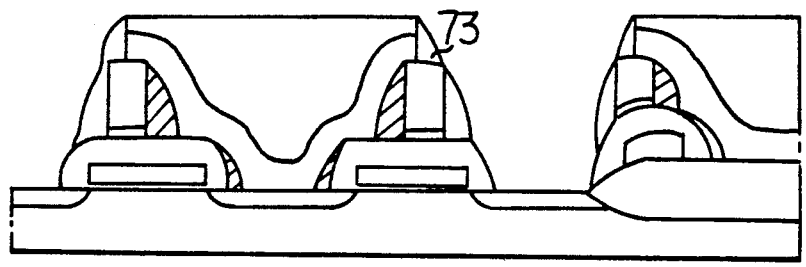
Figure 8G:
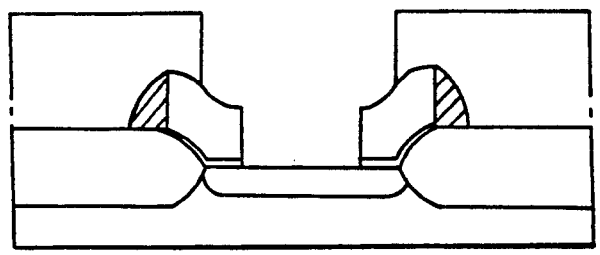
Figure 8H:
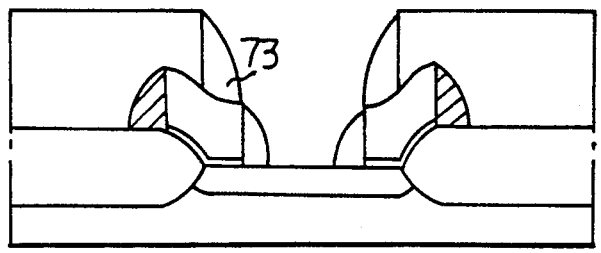

Henceforth, as shown in FIG. 7(g) and FIG. 8(g), the exposed nitride films 66 and 72 are removed and as shown in FIG. 7(h) and FIG. 8(h) the oxide film is deposited and then etched by an isotropic etching method to form the side wall 73.

Figure 7I:
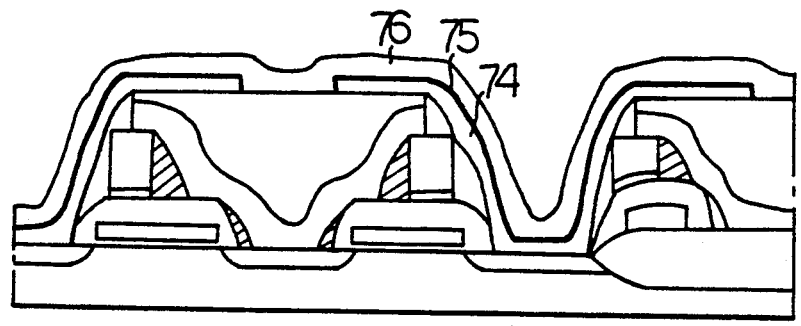
Figure 8I:
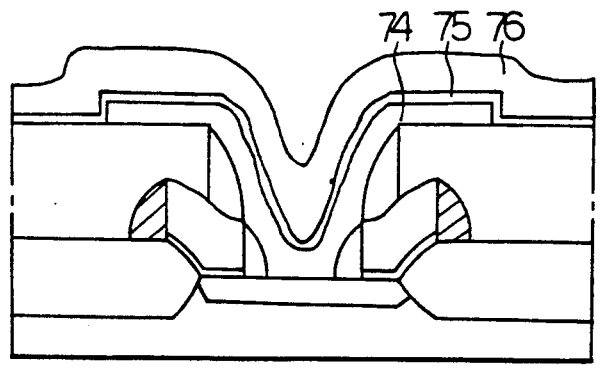

Finally, as shown in FIG. 7(i) and FIG. 8(i) the capacitor consisting of the storage node 73, a dielectric film 74 and a plate 75 is formed. Therefore, the semiconductor memory device in which the bit line 69 and the storage node 73 are overlapped is fabricated.

In the second embodiment, the bit line ring 68 and the bit line 69 are successively formed and the surface is levelled by using the insulating film 70 and therefore the bit line ring 68 is formed at the lower stage of the bit line 69.

In the semiconductor memory device fabricated by the aforesaid method, as shown in FIG. 6, the bit line 69 is formed perpendicularly to the word line 63 and the storage node 73 is formed in the same direction of the bit line ring 68 which functions as the bit line and is formed at the lower stage of the bit line 69 to be overlapped with said bit line 19 in a straight line.

In the above-mentioned semiconductor memory device in which the bit line 69 and the storage node 73 are overlapped in a straight line, the bent portion of the active region is avoided. Therefore, the capacitor area is extended and the integration degree can be improved.

According to the present invention, a storage node is overlapped on the bit line in a straight line in a capacitor contact portion. Therefore, a capacitor area can be increased without increase of an area of the unit cell to improve the integration degree of the semiconductor memory device and the generation of the bent portion of the active region can be prevented to decrease the distortion.

While there have been described what are, at present, considered to be preferred embodiments of the invention, it will be understood that various modifications may be made therein, and it is intended to cover in the appended claims all such modifications as fall within the true spirit and scope of the invention.

What is claimed is:

1. A semiconductor memory device comprising:
   a semiconductor substrate having a plurality of active regions, each active region including a laterally spaced source region and drain region;
   an insulating layer on said semiconductor substrate;
   a plurality of word lines, each word line isolated electrically from said semiconductor substrate;
   a plurality of drain contact connection layers, each drain contact connection layer extending through the insulating layer and into electrical contact with an associated drain region;
   a plurality of adjacent bit lines perpendicularly oriented with respect to the word lines, each bit line isolated electrically from said semiconductor substrate and electrically connected to a corresponding drain contact connection layer;
   a plurality of source contact connection layers, each source contact connection layer extending through the insulating layer and into electrical contact with an associated source region;
   a plurality of storage nodes linearly aligned with the bit lines and above the source regions, each storage node connected electrically to a corresponding source contact connection layer; and
   a plurality of refractory metal bit line rings, each bit line ring surrounding a corresponding storage node and electrically connecting adjacent bit lines.

2. A semiconductor memory device according to claim 1, wherein said drain contact connection layers and said source contact connection layers are made of doped polysilicon.

3. A semiconductor memory device according to claim 1, wherein said bit lines are made of a refractory metal.

4. A semiconductor memory device according to claim 1, wherein said insulating layer is made of oxide.

5. A semiconductor memory device according to claim 1, wherein at least portions of adjacent storage nodes and bit lines are positioned in overlapping relationship to one other.

6. A semiconductor memory device comprising:
   a semiconductor substrate having a plurality of active regions, each active region including a laterally spaced source region and drain region;
   an insulating layer formed on said semiconductor substrate;
   a plurality of word lines isolated electrically from said semiconductor substrate;
   a plurality of adjacent bit lines, each bit line isolated electrically from said semiconductor substrate and electrically connected to an associated drain region;
   a plurality of storage nodes linearly aligned with the bit line rings and above the source regions, each storage node connected electrically to an associated source region; and
   a plurality of refactory metal bit line rings, each bit line ring surrounding a corresponding storage node and electrically connecting adjacent bit lines.

7. A semiconductor memory device according to claim 6, wherein said bit lines are made of refractory metal.

8. A semiconductor memory device according to claim 6, wherein said insulating layer is made of oxide.

9. A semiconductor memory device according to claim 6, wherein at least portions of adjacent storage nodes and bit lines are positioned in overlapping relationship to one another.

* * * * *